United States Patent [19]

Sutera

[11] Patent Number: 4,976,993
[45] Date of Patent: Dec. 11, 1990

[54] NON-PRESSURE DRY GLOSSING OF RESIN-COATED SHEETS AND WEB MATERIAL

[75] Inventor: Richard Sutera, Centerville, Ohio

[73] Assignee: The Mead Corporation, Dayton, Ohio

[21] Appl. No.: 405,159

[22] Filed: Sep. 11, 1989

[51] Int. Cl.$^5$ ............................ B05B 5/00; B05D 3/02
[52] U.S. Cl. ........................................ 427/161; 118/68; 427/385.5; 427/391
[58] Field of Search ...................... 427/161, 391, 385.5, 427/322.2; 118/68

[56] References Cited

U.S. PATENT DOCUMENTS

| | | | |
|---|---|---|---|
| 3,567,484 | 3/1971 | White et al. | 117/17.5 |
| 3,623,710 | 11/1971 | Detig | 263/6 E |
| 3,788,873 | 1/1974 | Detig | 118/101 X |
| 3,813,261 | 5/1974 | Muller | 427/391 X |
| 4,364,976 | 12/1982 | Prokofievna et al. | 427/297 X |
| 4,526,803 | 7/1985 | White | 427/161 X |

Primary Examiner—Michael Lusigman
Attorney, Agent, or Firm—Biebel, French & Nauman

[57] ABSTRACT

Apparatus and method for transparentizing and glossing a resin-coated surface on sheet or web material which may comprise paper or transparency overhead projection stock, includes the delivery of such resin-coated material into intimate contact with non-wetting heated matter supplied in a pool or bath for a time sufficient to transfer heat by conduction from the non-wetting matter to the resin surface. The temperature of the bath is maintained above the glass transition temperature of the resin. The resin coated material may be applied by a roll partially immersed in the bath, or an offset or transfer roll may be positioned in the bath to deliver heated matter from the bath, in non-pressure relation, to the exposed resin surface.

12 Claims, 1 Drawing Sheet

NON-PRESSURE DRY GLOSSING OF RESIN-COATED SHEETS AND WEB MATERIAL

BACKGROUND OF THE INVENTION

This invention relates to apparatus and method for forming a gloss finish on or transparentizing resin-coated webs or sheets. Such material may be developer or receiver sheets as used in conjunction with photosensitive imaging systems employing microcapsules to provide visible image upon contact with a color precursor. Such imaging systems are the subject of commonly assigned U.S. Pat. Nos. 4,399,209; 4,416,966; and 4,440,846. The substrate may, for example, be paper or overhead projection base material (OHP).

The imaging systems described in the aboveidentified patents are characterized by an imaging sheet including a layer of microcapsules which contain photosensitive composition in the internal phase which is image-wise exposed to actinic radiation. U.S. Pat. No. 4,399,209 discloses a transfer system in which the imaging sheet is assembled with a developer or receiver sheet prior to being subjected to a rupturing force. Upon passing through a pressure developer, the microcapsules rupture and image-wise release the internal phase whereupon the color precursor migrates to the developer sheet where it reacts with the dry developer and forms a color image.

Developer or receiver sheets or webs are provided with a resin on the surface which may be glossed or transparentized by the application of heat and pressure, while supporting the sheet or web with the resin against a smooth or highly polished surface. The coalescing resin coating is found to improve the perceived image quality by increasing color saturation. The heated surface may be that of a heated convex plate, a roll, or a belt.

The resin coating may be a vinyl copolymer as disclosed in commonly assigned copending U.S. patent application Ser. No. 086,059 filed Aug. 14, 1987, now U.S. Pat. No. 877,767, or a phenolic resin as disclosed in commonly assigned U.S. patent application Ser. No. 073,036 filed June 14, 1987, now U.S. Pat. No. 4,859,561.

Such resins as currently used are obtained in a dispersed form and are roll and/or blade coated. Commonly the resin is finely ground or finely divided and dispersed in a carrier oil, and the resulting coating on the substrate, has a rather opaque, white or milky appearance. In the processing or glossing stage, it is necessary to transparentize this coating and provide thereon a suitable smooth high gloss surface condition.

The milky or opaque appearance of the coating, prior to transparentizing, is believed to be due to the reflection and refraction of light at the uneven surface, and additionally due to the breaking up of the light at the interfaces between the carrier and the dispersed particles. The latter may be viewed as small globules or spheres of particles under a microscope at between 200 and 500 power magnification.

The resin has a glass transition temperature $T_g$ in range in which the coating constituents, each having approximately the same index of refraction, coalesce into a common surface where the individual parts can no longer be visually or optically distinguished, and one which has a minimum of residual haze and a maximum of gloss, as may be measured on a conventional gloss meter.

A belt-type glosser for applying a gloss finish to such developer sheets is described in commonly assigned U.S. Pat. No. 4,761,311, the disclosure of which is incorporated herein by reference. In the above-identified patent, a polymer belt forms the glossing surface for the softening and finishing of the resin coating by the transfer of heat and pressure from a heated surface in running contact with the opposite side of the belt.

Typical thermoplastic developer resins which are capable of forming a film upon the application of heat and pressure are rather tacky compared to dry silver film, conventional film and xerographic material. Thus, the release conditions of the developer sheet surface from the belt can be critical.

Present glossing or transparentizing systems generally apply a combination of heat and pressure to the resin coating. The resin may be heated by way of conduction directly by contact under pressure with a heated glossing or casting surface. This means of glossing is more efficient than heating through the back side of the sheet or web material, but has the drawback that at relatively high temperatures, the resin tends to stick to most heated surfaces.

Another prior process of glossing employs the radiation heating of the resin surface. This process is relatively inefficient, requires high temperatures, and can cause resin damage at high energy densities.

SUMMARY OF THE INVENTION

This invention is directed to a method and apparatus for glossing and/or transparentizing the resin surface of coated web material or sheets, and more particularly to non-pressure dry glossing employ a heated pool or a quantity of non-wetting, flowable, non-sticking material.

The method and apparatus of this invention glosses and transparentizes the resin coating of the receiver web or sheet by transferring heat through conduction directly to the resin at a temperature above the glass transition temperature of the resin without pressurized mechanical contact with the web or the sheet. This is accomplished by subjecting the resin coating of the web or sheet to a bath or pool of heated non-wetting material. Such bath may consist of a metal immersion salt, a dry powdered metal, a heated powdered plastic, or a molten metal, as examples. The material of the pool should have a non-sticking characteristic such as flowable, finely divided bulk material or non-wetting liquid which, when in contact with the resin, transfers heat energy directly from the heated material to the resin. The material of the bath should have a relatively high specific heat as well as good heat conductivity.

The resin surface may make direct contact by immersion in a pool, or an offset roll or other apparatus may be employed for the purpose of bringing the matter or material of the pool into direct contact with the resin surface. The temperature of the pool may be maintained by suitable means, such as electric heaters, and the contact or dwell time must be sufficient so as to transfer heat by conduction from the bath to the resin surface, to coalesce the surface by raising the coating to a temperature at least 30 to the glass transition temperature $T_g$ of the resin.

The method and apparatus of this invention is an improvement over prior art mechanical heat transfer methods by reason of its ability to provide a high rate of heat transfer with a minimum of temperature differential. Further, the method and apparatus has the advantage in that they do not rely on a pressured mechanical contact with the resin coating at the glossing temperature, and there are no surfaces for the resin material to stick or adhere to. The invention is further characterized by the fact that the method and apparatus are capable of glossing at relatively high rates.

It is accordingly an object of this invention to provide a non-pressure dry glossing apparatus and method for the glossing of the resin of resin-coated sheets and webs.

A further object of the invention is the provision of a method and apparatus for the glossing of resin-coated receiver sheets by the direct heat transfer from a pool or bath of dry heat transfer material, such as a metal salt, a molten metal, or a heated powder non-wetting material.

These and other objects and advantages of the invention will be apparently from the following description, the accompanying drawings, and the appended claims.

BRIEF DESCRIPTION OF ACCOMPANYING DRAWINGS

DESCRIPTION OF PREFERRED EMBODIMENTS

Figure 1:
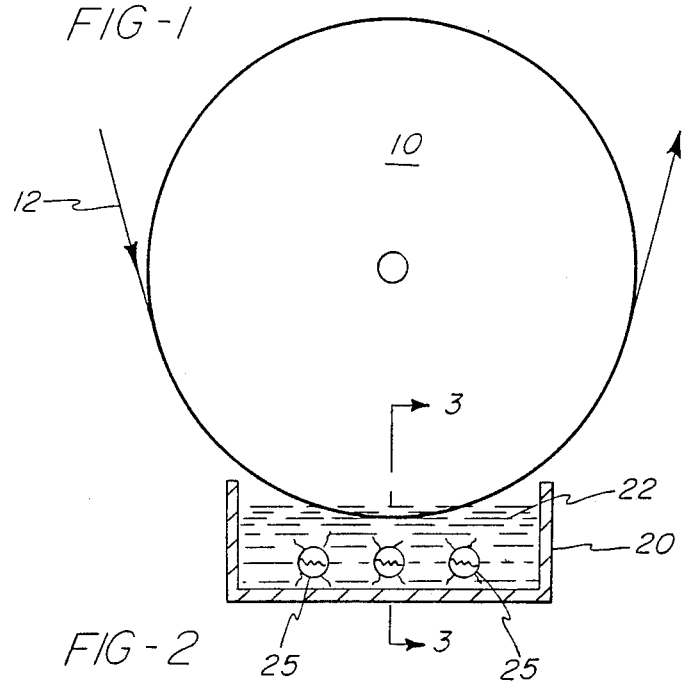
FIG. 1 is a diagrammatic view showing the application of resin-coated material to a heated non-wetting bath in accordance with this invention.

Referring to the figures of the drawing, which illustrate preferred embodiments of this invention, apparatus for the non-pressure dry transparentizing or glossing of resin-coated sheets and webs is shown in FIG. 1 as including a support roll 10 for supporting a web 12 of material to be glossed. The material, as illustrated in enlarged section in FIG. 3 includes a paper backing 14 and a resin coating 15 on the exposed face. The material, as previously noted, may be made in accordance with the teachings of the commonly assigned U.S. Pat. Nos. 4,399,209; 4,416,966 and 4,440,846.

The roll 10 supports or carries the web or the sheets into intimate contact with the exposed surface of a pool or bath 20 of heated non-wetting flowable material 22. The heat transfer matter or material 22 is maintained in the bath 20 at a temperature somewhat in excess of $T_g$. The bath 20 may be maintained at the desired temperature by any suitable means, such as by the immersed electric heater elements 25 shown in FIGS. 1 and 2.

The matter 22 may be a metal salt, a molten metal or a dry powdered plastic or metal, and should have a non-sticking characteristic when in contact with the resin coating 15 at the glossing temperature. It should also have a relatively high specific heat and good heat conductivity. Examples of suitable low melting temperature metal alloys include these of the Wood's metal family, mercury and lead.

Figure 2:
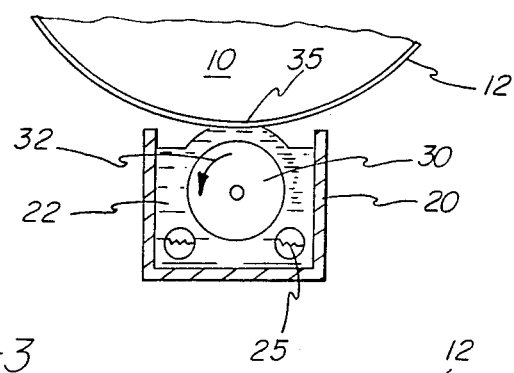
FIG. 2 shows a modified form of the bath in which a transfer roll is used to carry the non-wetting bath material to the resin surface of the sheet or web.
Figure 3:
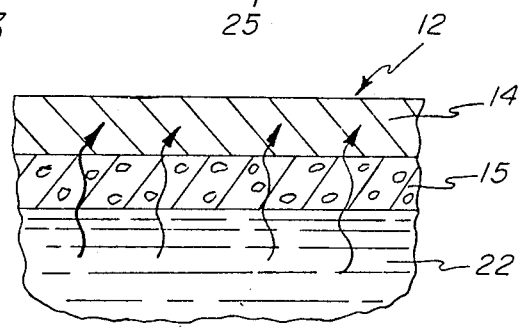
FIG. 3 is an enlarged diagram showing the heat conduction from the bath to the resin.

In some instances, it may be desirable to provide an intermediate offset roll or carrier roll in the bath, such as shown at 30 in FIG. 2. The roll 30 rotates in the direction of the arrow 32 and carries dry heated, non-wetting matter 22 into intimate contact with the resin to provide a resin-fluid interface as illustrated at 35. The extent of the interface, either by regulating the depth of immersion or the dwell time of the apparatus of FIGS. 1 or 2 is that which is necessary to provide a sufficient heat transfer, as illustrated in FIG. 3, from the material or matter 22 of the bath through the resin 15 to coalesce the resin.

If the dwell time is constant, then the bath temperature would need to be at a temperature that would cause a differential sufficient to allow ample heat energy to flow from the bath 22 to the resin 13, thereby raising the resin temperature beyond the glass transition temperature of the resin material to cause the resin particles to coalesce.

There is a close relationship between the bath temperature and dwell time to heat the resin coating. If the bath temperature is reduced, then the dwell time must be increased to heat the resin surface to a fixed temperature.

t = dwell time
k = thermal transfer constant
$T_B$ = bath temperature (about $T_g$)
$T_R$ = desired resin surface temperature
$T_g$ = resin glass transition temperature
$T_R = T_B t k$ where $T_R$ - constant, and where $T_B > T_g$ With respect to the classes of resin polymers disclosed in the above-identified copending U.S. applications, $T_g$ is generally between about 125° C. and 130° C.

It is thereby seen that this invention provides a method of forming a gloss on resin-coated sheet or web material which comprises the steps of supplying a pool of non-wetting heated matter, and applying the same to the exposed resin surface for a time sufficient to transfer heat by direct conduction from the non-wetting matter to the resin surface. The resin-coated material may be paper or OHP material as previously described.

The invention further provides apparatus for the non-pressure dry glossing of resin coated sheet and web material which includes means for supporting the material or matter to a resin surface, such as either by direct contact in a bath or by an offset roll, as illustrated in FIG. 2, with a dwell time sufficient to transfer heat by conduction from the matter of the bath to the surface.

While the methods herein described, and the form of apparatus for carrying these methods into effect, constitute preferred embodiments of this invention, it is to be understood that the invention is not limited to these precise methods and form of apparatus, and that changes may be made in either without departing from the scope of the invention, which is defined in the appended claims.

What is claimed is:

1. The method of glossing or transparentizing a resin coating surface or sheet on web material, comprising the steps of:
   supplying a pool of non-wetting heated matter having a non-sticking characteristic and having a relatively high specific heat and good heat conductivity, and
   applying the resin-coated surface of such material directly to said heated matter in said pool for a time sufficient to transfer heat by conduction from said matter to said surface and to coalesce the resin coating.

2. The method of claim 1 in which said applying step includes the immersion of such material into a bath of such heated matter.

3. The method of claim 1 in which said applying step includes the delivery of such heated matter from said pool to the resin coated surface by an offset roll in said pool.

4. The method of glossing or transparentizing a resin coating on the surface of sheet or web material, comprising the steps of:

supplying a bath of non-wetting heated matter having a non-sticking characteristic and having a relatively high specific heat and good heat conductivity, maintaining the temperature of said bath at a temperature above the glass transition temperature of said resin, applying said resin coating on such material to the heated matter in said bath in non-pressure relationship to form an intimate contact between said heated matter and said resin coating for a time sufficient to transfer heat by conduction from said bath to said resin coating to coalesce the resin coating, and removing the resin coating from said bath.

5. Apparatus for the non-pressure dry glossing or transparentizing of the resin surface of resin-coated sheet and web material, comprising:

means for supporting said material with the resin surface exposed, a pool of heated non-wetting flowable matter, means applying said heated matter to said resin surface for a time sufficient to transfer heat by conduction from said heated matter to said resin surface.

6. The apparatus of claim 5 in which said matter is a metal salt.

7. The apparatus of claim 5 in which said matter is molten metal.

8. The apparatus of claim 5 in which said matter is dry powdered metal.

9. The apparatus of claim 5 in which said matter is a dry powdered plastic polymer.

10. The apparatus for non-pressure dry glossing or transparentizing of a resin coating on sheet or web material, comprising:

roll means supporting said material with the resin coating exposed, a pool of heated non-wetting flowable matter, said pool being positioned with respect to said roll means so that said resin coating is applied to the flowable matter of said pool for a dwell time sufficient to transfer heat by conduction from said matter to said resin surface.

11. The apparatus of claim 10 in which a portion of said roll is immersed in said pool.

12. The apparatus of claim 10 further comprising means defining an offset roll in said pool positioned to carry heated matter from said pool into non-pressure contact with said resin surface.

* * * * *